United States Patent [19]

Manlove

[11] Patent Number: 4,727,591
[45] Date of Patent: Feb. 23, 1988

[54] MICROPROCESSOR CONTROLLED TUNING SYSTEM

[75] Inventor: Nathan E. Manlove, Columbus, Ind.

[73] Assignee: Arvin Industries, Inc., Columbus, Ind.

[21] Appl. No.: 903,505

[22] Filed: Sep. 4, 1986

[51] Int. Cl.[4] .......................... H04B 1/16; H04B 1/26
[52] U.S. Cl. .................... 455/182; 455/183; 455/164
[58] Field of Search ............... 455/164, 165, 182, 183, 455/185, 186, 131

[56] References Cited

U.S. PATENT DOCUMENTS

| | | |
|---|---|---|
| 3,573,355 | 4/1971 | Cavelos . |
| 3,821,650 | 6/1974 | Kase et al. . |
| 3,864,636 | 2/1975 | Fukuda et al. . |
| 4,078,212 | 3/1978 | Rast . |
| 4,155,043 | 5/1979 | Sakamoto . |
| 4,163,259 | 7/1979 | Skerlos . |
| 4,240,115 | 12/1980 | Kamiya . |
| 4,241,450 | 12/1980 | Blatter et al. . |
| 4,245,351 | 1/1981 | Tults . |
| 4,271,530 | 6/1981 | Van Deursen ............... 455/183 |
| 4,291,413 | 9/1981 | Henderson et al. . |
| 4,298,988 | 11/1981 | Dages . |
| 4,298,989 | 11/1981 | Someno et al. ............... 455/183 |
| 4,403,345 | 9/1983 | Graner et al. ............... 455/183 |
| 4,408,349 | 10/1983 | Yukawa . |
| 4,422,096 | 12/1983 | Henderson . |
| 4,498,191 | 2/1985 | Rogers . |
| 4,542,533 | 12/1985 | Parker . |

FOREIGN PATENT DOCUMENTS

| | | |
|---|---|---|
| 49711 | 4/1977 | Japan . |
| 141558 | 9/1978 | Japan . |
| 23674 | 2/1980 | Japan . |
| 35573 | 3/1980 | Japan . |
| 79325 | 5/1983 | Japan . |
| 81341 | 5/1983 | Japan . |
| 219815 | 12/1983 | Japan . |
| 2143691 | 2/1985 | United Kingdom . |

OTHER PUBLICATIONS

Ahrens, "A Radio Set Phase-Lock Loop (PLL) Using an MC6805T2()2 Single-Chip Microcomputer", Application Note AN-883, Motorola Inc, 1983.

Primary Examiner—Michael A. Masinick
Attorney, Agent, or Firm—Barnes & Thornburg

[57] ABSTRACT

A tuning system receives signals from a radio frequency source and supplies an intermediate frequency signal to a signal detector under the control of a microprocessor. The microprocessor reads a channel selector and produces a control voltage which is used to tune the system to the selected channel. The intermediate frequency signal is connected to the microprocessor and a direct measure of the actual IF signal frequency is used by the processor to continuously adjust the tuner to compensate for drifting of the RF signal. In a preferred embodiment, the IF signal increments a counter in the microprocessor for a predetermined period of time to provide a direct measure of the actual IF signal frequency.

19 Claims, 5 Drawing Figures

MICROPROCESSOR CONTROLLED TUNING SYSTEM

BACKGROUND AND SUMMARY OF THE INVENTION

This invention relates generally to tuning systems for receivers, and more particularly to a microprocessor controlled tuning system which has an automatic frequency control feature and which is particularly well suited for use in a satellite signal receiver.

Conventional satellite signal receiving systems typically include an outdoor dish-type antenna arrangement which receives a line of-sight microwave signal from a satellite transponder, and which relays the signal via coaxial cable to a remotely located receiver. The antenna arrangement usually includes a low-noise amplifier, for boosting the level of signals received from the satellite, and a block down frequency converter for converting the frequencies of the received signals to lower levels to reduce the costs and increase the efficiencies associated with transmitting the signals to the receiver.

The block down converter at the antenna has a local oscillator which produces a high frequency (e.g., 5150 Megahertz) signal used to convert the signals coming from the low-noise amplifier to the desired frequency range. However, since the converter is usually located on or near the outdoor dish antenna, the local oscillator in the converter is exposed to environmental conditions (such as temperature extremes) which cause variations in the local oscillator signal frequency, resulting in variations or drifting of the frequencies provided to the receiver. Although tuning systems for receivers are often provided with circuitry for compensating for frequency variations of the local oscillator located in the tuner portion of the receiver, such circuitry is not effective to compensate for variations in frequency of the signal provided to the receiver by the antenna arrangement, such as might be caused by drifting of the local oscillator in the block down converter. These variations can, however, be effectively compensated by incorporating an automatic frequency control or tracking feature in the tuning system of the receiver.

One example of a microprocessor controlled tuning system which incorporates an automatic frequency control feature is shown in U.S. Pat. No. 4,498,191 to Rogers. In this system, a radio frequency (RF) signal is mixed with a signal from a voltage controlled oscillator (VCO) to produce an intermediate frequency (IF) signal which serves as a carrier signal for video and audio information. The tuning system uses a microprocessor controlled phase locked loop to maintain the input voltage to the VCO at a level which results in proper tuning of a selected channel. To compensate for IF signal variations, a portion of the IF amplifier includes an automatic frequency control (AFC) detector which provides a voltage output to one input of an AFC comparator. This voltage is compared to a predetermined threshold or reference voltage which is provided at a second comparator input. The comparator output is connected to the microprocessor, and the comparator produces a logic "0" or a logic "1" output to the microprocessor depending on whether the voltage output from the AFC detector is above or below the threshold. When the microprocessor is operated in a tracking mode, the threshold or reference voltage is periodically and temporarily changed to either of two preset values to generate a "window" which tracks the tuning frequency.

An apparent modification of the Rogers circuit is shown in U.S. Pat. No. 4,542,533 to Parker. In this patent, the output of the AFC detector is similarly connected to one AFC comparator input, and the output of the comparator is connected to the microprocessor. The second comparator input is connected to an increasing voltage from a time constant network controlled by the microprocessor. In the tracking mode, the microprocessor alternately increments a register and reads the output of the comparator until the voltage from the time constant network exceeds the error voltage from the AFC detector. The value in the register is then proportional to the error voltage, and is used to adjust the tuner if necessary.

In circuits of the above-discussed types, the analog AFC detector must be adjusted and calibrated during production. If this is done improperly, or if the reference voltage in the detector subsequently drifts, errors can be introduced into the AFC loop. Furthermore, since the AFC detector produces an analog error voltage signal, use of a circuit (such as the comparator) which will effectively convert the analog signal to a digital signal is reguired for interfacing with the microprocessor.

An object of the present invention is to provide an improved microprocessor controlled tuning system having an automatic frequency control feature which is more cost efficient to manufacture and more flexible in operation than previously known systems.

Another object of the present invention is to provide a microprocessor controlled tuning system in which the parameters of the AFC loop are under software control.

Yet another object of the present invention is to provide a microprocessor controlled tuning system having an AFC feature which can be implemented with relatively few hardware components.

Still another object of the present invention is to provide a microprocessor controlled tuning system having an AFC feature which can be easily adjusted in response to changes in operating conditions, or to facilitate reception of signals from a variety of signal sources.

These and other objects are attained in a microprocessor controlled tuning system which includes a tuner for receiving an RF signal and for supplying an IF signal to a signal detector, a feedback circuit for connecting the IF signal to the microprocessor, and an arrangement for directly measuring the actual frequency of the IF signal and for adjusting the tuner to compensate for variations from the desired frequency caused by drifting of the incoming RF signal. In a preferred embodiment, the tuner includes a mixer which receives signals from an RF signal amplifier and a voltage controlled oscillator to generate the IF signal. The voltage input to the VCO is supplied by a microprocessor controlled phase locked loop. The microprocessor is responsive to a user input channel selection to produce an output associated with the particular selection and to supply the output to a programmable frequency divider. The output of the frequency divider is compared to a reference frequency and a voltage signal is generated to control the VCO. In this preferred embodiment, the IF signal is connected to a counting register in the microprocessor. The microprocessor periodically resets the register to zero and allows the IF signal to increment the register for a predetermined period of time. The resulting value in the register is a direct measure of the actual frequency of the IF signal. If the actual IF signal frequency is above or below a predetermined frequency range, the output supplied to the programmable frequency divider is adjusted accordingly. In the preferred embodiment, the output to the programmable frequency divider is adjusted when the measured frequency of the IF signal remains outside the predetermined frequency range for a predetermined period of time. Adjustment of the output to the programmable frequency divider is prevented if, after adjustment, the output would exceed predetermined upper and lower limits associated with each respective channel.

A preferred manner of operating the tuning system of the present invention includes: reading the user input channel selection; setting the output to the programmable frequency divider to a value associated with the selected channel; taking a direct measure of the actual frequency of the intermediate frequency signal; comparing the measured actual frequency to a predetermined range of frequencies; and adjusting the output to the programmable frequency divider if the actual measured frequency is above or below the predetermined frequency range. In an especially preferred manner of operation, the value of the adjusted output to the programmable frequency divider is compared with a predetermined range of outputs to determine if the adjusted output is within the range. If necessary, the output is readjusted to maintain the output within the range. The direct measure of the actual frequency of the IF signal is made by connecting the IF signal to a counting register on the microprocessor, incrementing the register with the IF signal for a predetermined period of time and reading the contents of the register subsequent to the predetermined time period to obtain a direct measure of the IF signal frequency. A frequency divider may be provided to scale the frequency of the IF signal down to a level which facilitates incrementing the register. However, the digital value in the register is still directly representative of the frequency of the IF signal.

An important advantage of the present invention over previously known techniques is the extent to which software, rather than hardware, is used to control the parameters of the automatic frequency control feature. This greatly increases the flexibility of the tuning system and enhances both operability and applicability of the tuning system to changing conditions in the field. For example, the capture and release ranges of the AFC portion of the system can be adjusted by reprogramming the microprocessor. The system also allows for a channel window to be scanned for the presence of a suspected signal during or following a signal loss. Skewed IF filters, and other irregularities, can be accounted for by programming in correction factors which would be taken into consideration each time a tuning operation and AFC cycle is performed. Channel frequency allocations and channel windows can also easily be changed by reprogramming. This advantage is particularly important when using the receiver to receive satellite signals since some satellites have different numbers of channels and different channel allocations than do others.

Other objects, advantages and novel features of the present invention will become apparent from the following detailed description of the invention when considered in conjunction with the accompanying drawings.

DETAILED DESCRIPTION OF THE DRAWINGS

Figure 1:
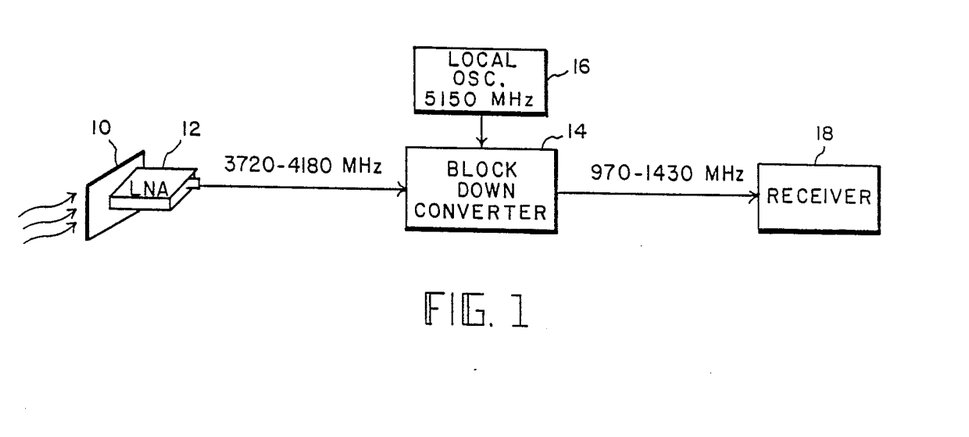
FIG. 1 shows a schematic block diagram of a satellite signal receiving arrangement.

FIG. 1 is a schematic block diagram of a satellite signal receiving arrangement which includes antenna 10, frequency converter 14, and receiver 18. Antenna 10 is typically a dish-shaped antenna aimed in the direction of the incoming satellite signals. Attached to antenna 10 is low noise amplifier (LNA) 12 for boosting the received signals, and frequency converter 14 which is a block down converter for converting the 3,720-4,180 MHz (Megahertz) signals received from the satellite down to 970-1,430 MHz for transmission to the remotely located receiver. This conversion allows for economical transmission of and access to all frequencies transmitted by a satellite, which may typically be provided with up to 24 transponders. Frequency converter 14 is provided with local oscillator 16 which preferably operates at 5,150 MHz. Since converter 14 is located at the dish antenna, local oscillator 16 is exposed to variations in environmental conditions (such as temperature, humidity, etc.) occurring at the antenna site. The operating frequency of local oscillator 16, and consequently, the frequencies of the signals coming from the output of converter 14, may vary in response to these environmental changes.

Figure 2:
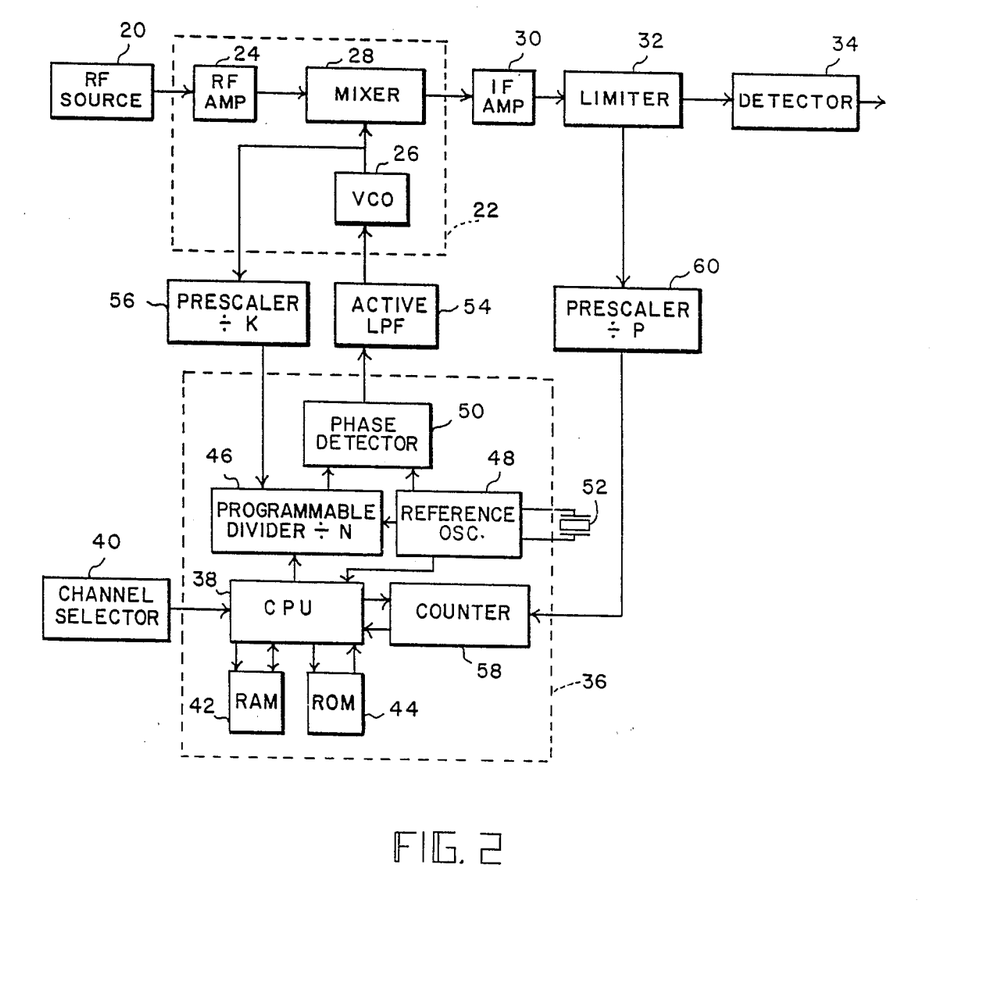
FIG. 2 shows a schematic block diagram, in accordance with the present invention, of the receiver portion of FIG. 1.

FIG. 2 shows a schematic block diagram of receiver 18 of FIG. 1. Receiver 18 is typically connected to frequency converter 14 by a coaxial cable. This source of radio frequency signals incoming to the receiver is represented in FIG. 2 by block 20. Receiver 18 has a tuner section 22 which includes RF amplifier 24, voltage controlled oscillator 26, and mixer 28. RF amplifier 24 amplifies the signals received from RF source 20 and supplies these signals to a signal input of mixer 28. The controllable local oscillator signal supplied by VCO 26 is coupled to an oscillator input of mixer 28. Mixer 28 mixes these signals to generate an intermediate frequency (IF) signal which preferably has a nominal frequency of 70 MHz. Tuner 22 is thus a superheterodyne tuner.

The frequency of the local oscillator, VCO 26, determines which of the signals supplied to the signal input of mixer 28 from RF source 20 (the satellite) by RF amplifier 24 is used to form the 70 MHz IF signal. By varying the voltage supplied to VCO 26, different signals from RF source 20 (the satellite) are used to form the 70 MHz IF signal. Thus, a particular satellite channel is selected by supplying an appropriate voltage to VCO 26.

IF amplifier 30 amplifies the IF signal, which is then transmitted to the input of limiter 32. Limiter 32 brings the IF signal up to a predetermined level before transmitting the signal to signal detecting device 34.

The tuning system for receiver 18 includes a microprocessor controlled phase locked loop which is indicated generally by reference numeral 36 in FIG. 2. A suitable microprocessor having an on-board phase locked loop is the MOTOROLA Series 6805T2. The microprocessor includes CPU 38 which receives an input from user operated channel selector 40. CPU 38 uses Random Access Memory (RAM) 42 and Read Only Memory (ROM) 44 for storage of the data and instructions required for processing the incoming channel selection information and for tuning the on-board phase locked loop. The phase locked loop includes programmable divider 46, reference oscillator 48 and phase detector 50. Programmable divider 46 is controlled by CPU 38. The divide-by-N number supplied by CPU 38 and latched into divider 46 controls the voltage output of phase detector 50 and, in turn, the voltage input to VCO 26 which allows the local oscillator frequency in the tuner to be varied. Reference oscillator 48, which is preferably controlled by crystal 52 operating at 4 MHz, is provided to supply a stable output frequency which acts as a reference frequency for CPU 38 and phase detector 50. Phase detector 50 detects the phase difference between the signals incoming from reference oscillator 48 and programmable divider 46 and supplies this difference to active filter 54 for conditioning. Filter 54 is an active low pass filter which changes the output of phase detector 50 to a stable DC voltage which is provided as an input to control VCO 26 in tuner 22. The output of VCO 26 is fed back through prescaler 56 to programmable divider 46 to lock the local oscillator frequency on the selected channel. Prescaler 56 is a frequency dividing device with a divide-by ratio of K which reduces the frequency of the local oscillator signal to a rate which is more easily processed by the phase locked loop.

The circuit of FIG. 2 is also provided with an automatic frequency control (AFC) feature which detects and adjusts for variations in the IF signal frequency caused, for example, by drifting of the signal incoming from RF source 20. The AFC feature includes a feedback connection from limiter 32 to the microprocessor. The IF signal is transmitted along this path and is provided as an input to counting register 58 in the microprocessor. Frequency divider 60, having a divide by ratio of P, is provided between the output of limiter 32 and the input to counting register 58 to scale the frequency of the IF signal down to a level which is more easily handled by register 58. Register 58 is controlled by CPU 38 which periodically resets the counter to zero and allows the IF signal coming from prescaler 60 to increment the register for a predetermined time period. The digital value in register 50 is directly representative of the frequency of the IF signal. This provides a direct measure of the actual IF signal frequency which is used by CPU 38 in making further adjustments to programmable divider 46, as will be discussed more thoroughly below. By using this direct approach to measuring the actual frequency of the IF signal, problems which are often encountered when interfacing analog and digital signals are avoided. This arrangement is also more flexible than previously known techniques since all parameters of the AFC loop are under software control (i.e., by CPU 38), and window, scan, or other tuning techniques can be employed.

Figure 3:
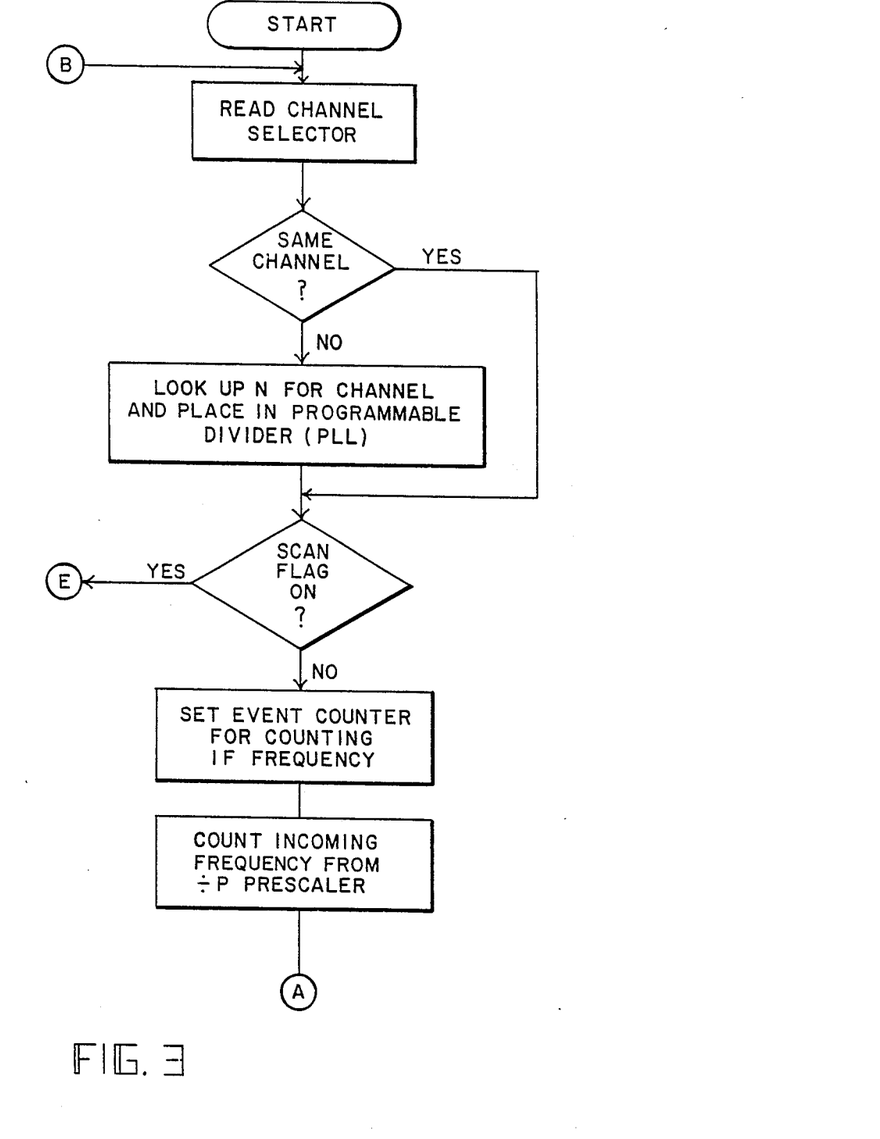
FIGS. 3-5 are flow chart diagrams illustrating the preferred manner of operating the receiver of FIG. 2.
Figure 4:
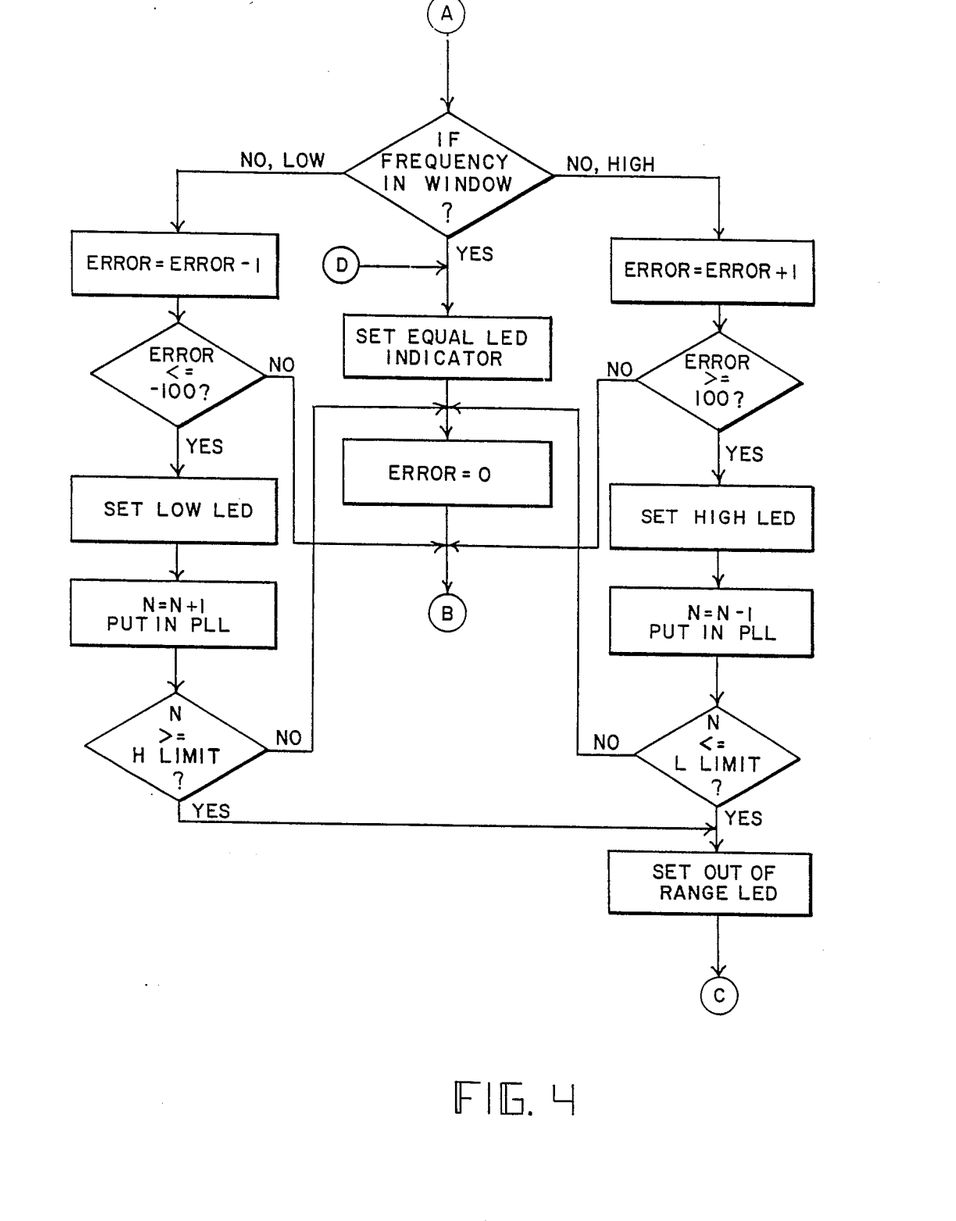
Figure 5:
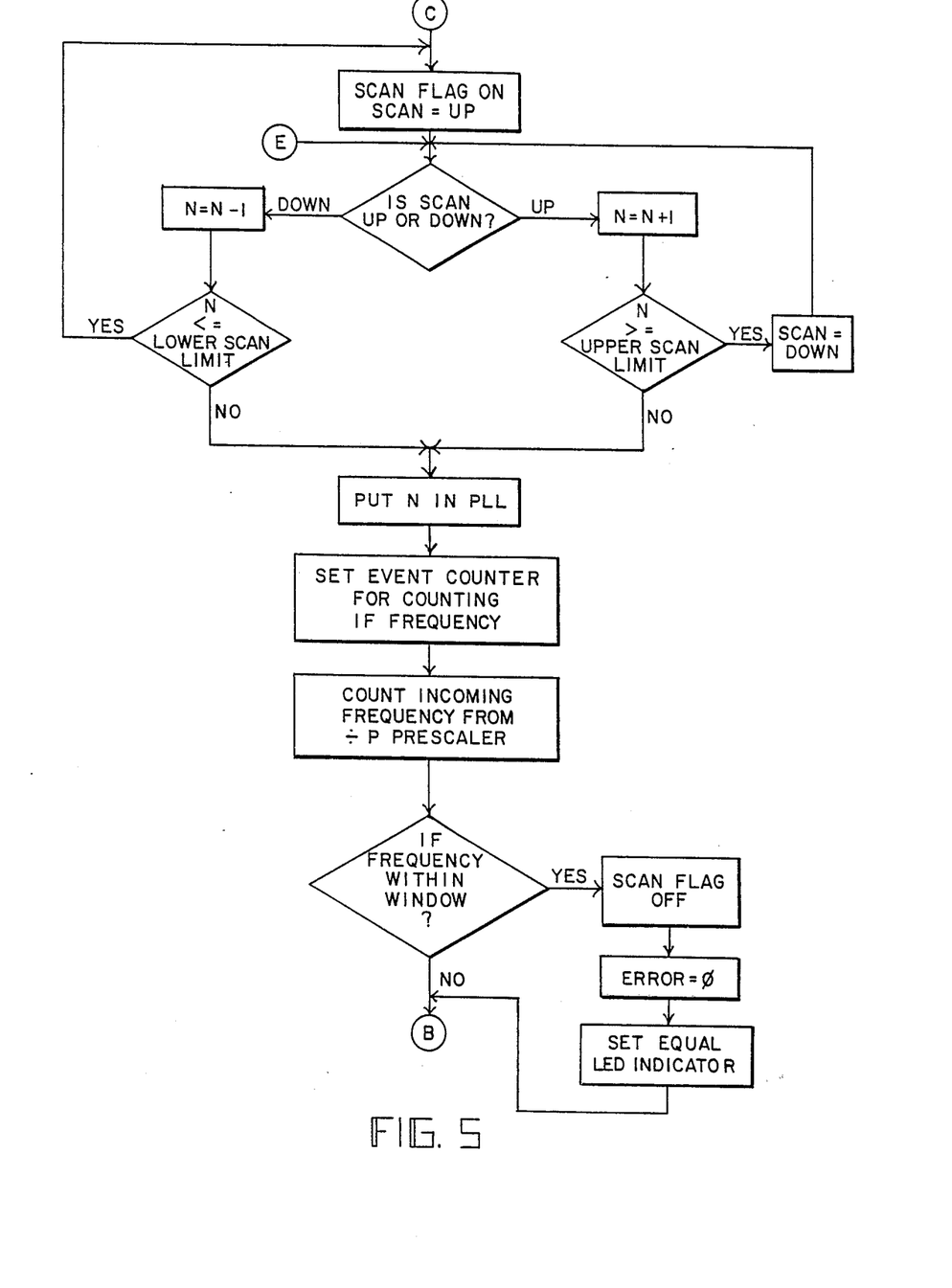

FIGS. 3–5 are flow chart diagrams which illustrate a preferred manner of operating the receiver of FIG. 2. With reference to FIG. 3, the operating cycle begins when CPU 38 reads the user channel selection incoming from channel selector 40. CPU 38 checks to see if the channel is the same channel as it read from channel selector 40 at the beginning of its last operating cycle. If the channel is the same, CPU 38 branches as illustrated to see if the scan flag is on. If the channel is not the same, CPU 38 looks up a number N which is associated with the selected channel and places that number in programmable divider 46. In the preferred embodiment illustrated, 24 channels are provided and the values of N start with 3,000 for channel number 1 and decrease by 40 for each of the remaining channels to a value of 2,080 for channel 24. The preferred channel spacing is 20 MHz. Thus, each channel has a bandwidth of 20 MHz (nominal frequency ±10 MHz).

CPU 38 next checks to see if the scan flag is on. If it is, CPU 38 branches into the scan routine as shown by the circled "E".

After the initial value of N is placed in programmable divider 46, phase detector 50 acts to adjust the voltage provided to voltage controlled oscillator 26 to adjust the tuner to the selected channel. The phase locked loop arrangement assures the stability of this portion of the tuning system and corrects for any variations in the local oscillator frequency at the output of VCO 26.

If the scan flag is not on, CPU 38 begins operation of the automatic frequency control feature. CPU 38 sets the event counter, counting register 58, to zero and permits register 58 to count the frequency of the IF signal incoming from prescaler 60 for a predetermined period of time. CPU 38 then reads the value in register 58 to obtain a direct measure of the actual IF signal frequency. Illustratively, CPU 38 does this every 500 μsec. If the frequency of the IF signal has drifted above or below predetermined upper and lower frequency limits for the IF signal (caused, for example, by drifting of the incoming RF signal due to temperature variations at the antenna), adjustment of the phase locked loop is initiated. In the preferred embodiment illustrated, the upper and lower limits for the 70 MHz IF frequency are 71 and 69 MHz, respectively. It should also be noted that, in the preferred manner of operation illustrated by FIGS. 3–5, a damping feature is incorporated into the operating cycle which requires that the actual IF frequency remain outside of the upper and lower limits for a predetermined number of consecutive measurements before actual adjustment of the phase locked loop is initiated. The damping or error counter illustrated in the flow chart of FIG. 4 requires that the IF frequency remain outside the window created by the upper and lower frequency limits for a minimum of 100 measurement cycles before adjustment of the phase locked loop begins.

With further reference to FIG. 4, if the IF frequency drifts outside of the predetermined range or window for a sufficient number of measurement cycles, CPU 38 decrements or increments the value N supplied to programmable divider 46, depending upon whether the IF frequency is too high or too low, respectively and accordingly sets a high or low LED (not shown). After making this adjustment, CPU 38 determines whether or not the new value of N is below or above predetermined lower and upper limits for IF drift compensation. These upper and lower limits in the preferred embodiment illustrated are the nominal value of N for a selected channel, plus or minus 15 (nominal frequency ±7.5 MHz). If the value of N lies within these limits, the damping counter is reset to zero and a new measurement cycle is initiated. If the adjusted value of N lies outside of the selected limits, CPU 38 determines that the signal from the satellite for the channel selected by channel selector 40 has been lost. CPU 38 then branches to the scan routine shown in FIG. 5.

The scan routine is used to compensate for an IF that is outside the upper and lower limits for IF drift compensation. Illustratively, the scan routine will adjust VCO 26 so that the entire bandwidth for the channel selected by channel selector 40 is swept in an attempt to get an IF which falls within the preferred window of 69-71 MHz. That is, N is incremented or decremented up to 20 times so that, in the illustrated embodiment, VCO 26 is adjusted throughout the bandwidth for the selected channel.

When a satellite signal is "lost" due to noise or the like, it is often the case that its nominal frequency has increased. Thus, the frequency of the IF signal from mixer 28 also increases. The scan routine brings the frequency of the IF signal back to the nominal 70 MHz±1 MHz when this occurs by adjusting VCO 26 as described.

Referring to FIG. 5, the scan routine will now be described in detail. CPU 38 first sets the scan flag on and sets the scan for an up scan. CPU 38 next checks to see if it is to scan up or down. This step is also the point to which CPU 38 branches from FIG. 3 after it finds the scan flag on.

Assuming CPU 38 is to scan up, it next increments N and checks to see if N has exceeded the upper scan limit. Illustratively, the upper scan limit is the nominal value of N for the selected channel plus 20 (the upper limit of the bandwidth for the selected channel). If N has exceeded the upper scan limit, CPU 30 switches to scan down. CPU 38 then returns to the step where it checks to see if it is to scan up or down.

If CPU 38 determines that it is to scan down, it decrements N by one. It next checks to see if N has fallen below the lower scan limit. Illustratively, the lower scan limit is the nominal value of N for the selected channel minus 20 (the lower limit of the bandwidth for the selected channel). If N has fallen below the lower scan limit, CPU 38 switches to scan up. CPU 38 then returns to the step where it checks if it is to scan up or down.

If the newly incremented or decremented N falls within the upper and lower scan limits, CPU 38 loads the incremented or decremented N into programmable divider 46 of the phase lock loop. Counting register 58 is reset to zero and accumulates a new count of the frequency of the IF signal. CPU 38 then reads the new IF frequency from counting register 38 and checks to see if it is 70 MHz±1 MHz. If it is, CPU 38 turns the scan flag off, clears the error counter by setting it to zero, and sets an "EQUAL" LED indicator (not shown) so that it indicates that the IF frequency is within the 70 MHz±1 MHz window and starts its operating cycle over. Otherwise, the scan flag is left as it was and CPU 38 starts its operating cycle over.

The circuit and manner of operation illustrated by Figures 1-5 assure rapid and accurate adjustment of the IF signal frequency in response to variations caused by, for example, excessive drifting of the incoming RF signal. Adjustment is accomplished with a minimal amount of hardware and in a simplified and highly flexible manner. Allowing the IF signal to directly increment counting register 58 to provide a direct measure of signal frequency provides a highly accurate measure of actual IF signal frequency, while reducing the hardware requirements and complexity of the AFC loop.

From the preceding description of the preferred embodiments, it is evident that the objects of the invention are attained. Although the invention has been described and illustrated in detail, it is to be clearly understood that the same is intended by way of illustration and example only and is not to be taken by way of limitation. The spirit and scope of the present invention are to be limited only by the terms of the appended claims.

What is claimed is:

1. A microprocessor controlled phase locked loop tuning system, comprising: a phase locked loop controlled by a microprocessor, means responsive to a user input channel selection to produce an output and to supply said output to a programmable frequency divider in the phase locked loop which determines a nominal operating frequency of a local oscillator in tuner, said tuner including a mixer for combining a radio frequency input signal with a signal form the local oscillator to produce an intermediate frequency signal which is supplied to a signal detector;

means for connecting the intermediate frequency signal to a counting register to provide a direct measure of the actual frequency of the intermediate frequency signal, and means for supplying said direct measure of frequency to the microprocessor; and means for adjusting the output supplied to the programmable frequency divider when the measured frequency of the intermediate frequency signal is outside a predetemined frequency range.

2. The microprocessor controlled phase locked loop tuning system according to claim 1, wherein the means for adjusting the output supplied to the programmable frequency divider responds to adjust said output only when the measureed frequency of the intermediate frequency signal remains outside the predetermined frequency range for a predetermined time period.

3. The system of claim 1 wherein the radio frequency input signal has a carrier frequency and the means for adjusting the output supplied to the programmable frequency divider when the measured frequency signal is outside a predetermined range adjusts the output supplied to the programmable frequency divider to adjust the nominal frequency of the local oscillator to compensate for changes in the carrier frequency of the radio frequency input signal.

4. A microprocessor controlled phase locked loop tuning system, comprising: a phase locked loop controlled by a microprocessor, means responsive to a user input channel selection to produce an output and to supply said output to a programmable frequency divider in the phase locked loop which determines a nominal operating frequency of a local oscillator in a tuner, said tuner including a mixer for combining a radio frequency input signal with a signal from the local oscillator to produce an intermediate frequency signal which is supplied to a signal detector;

means for connecting the intermediate frequency signal to a counting register in the microprocessor;

means for periodically resetting said register and for reading the contents thereof after a predetermined time period to provide a direct measure of the actual frequency of the intermediate frequency signal; and means for adjusting the output supplied to the programmable frequency divider when the measured frequency of the intermediate frequency signal is above or below a predetermined frequency range.

5. The microprocessor controlled phase locked loop tuning system according to claim 3, wherein the means for adjusting the output supplied to the programmable frequency divider responds to adjust said output when the measured frequency of the intermediate frequency signal remains outside the predetermined frequency range for a predetermined time period.

6. A microprocessor controlled phase locked loop tuning system according to claim 5, further comprising means for preventing adjustment of the output to the programmable frequency divider beyond a range defined by predetermined upper and lower limits associated with each respective channel selected by the user.

7. A microprocessor controlled phase locked loop tuning system according to claim 4, wherein said means for connecting the intermediate frequency signal to the register includes a frequency divider.

8. The system of claim 4 wherein the radio frequency input signal has a carrier frequency and the means for adjusting the output supplied to the programmable frequency divider when the measured frequency signal is outside a predetermined range adjusts the output supplied to the programmable frequency divider to adjust the nominal frequency of the local oscillator to compensate for changes in the carrier frequency of the radio frequency input signal.

9. A method for tuning a microprocessor controlled phase locked loop tuning system having a microprocessor which is responsive to a user input channel selection to produce an output associated with said selection and to supply said output to a programmable frequency divider in the phase locked loop which determines a nominal frequency of a local oscillator in a tuner, said tuner including a mixer for combining a radio frequency input signal with a signal from the local oscillator to produce an intermediate frequency signal which is supplied to a signal detector, comprising the steps of:
(a) reading the user input channel selection;
(b) setting the output to the programmable frequency divider to a value associated with the selected channel;
(c) taking a direct measure of the actual frequency of the intermediate frequency signal;
(d) comparing the actual frequency measured in step (c) with a predetermined range of frequencies for the intermediate frequency signal; and
(e) adjusting the output to the programmable frequency divider if the actual frequency determined in step (c) is above or below the predetermined frequency range.

10. A method for tuning a microprocessor controlled phase locked loop tuning system according to claim 9, comprising the additional steps of:
comparing the adjusted output with a predetermined output range to determine if the output is within said range, and readjusting the output, if necessary, to maintain the output within said range.

11. A method for tuning a microprocessor controlled phase locked loop tuning system according to claim 9, wherein the step of measuring the actual frequency of the intermediate frequency signal includes the steps of:
connecting the intermediate frequency signal to an input to a register on the microprocessor;
incrementing the register with the intermediate frequency signal for a predetermined period of time; and
reading the contents of the register subsequent to said predetermined period of time to obtain a direct measure of the frequency of the intermediate frequency signal.

12. The method of claim 9 wherein the radio frequency input signal has a carrier frequency and the step of adjusting the output to the programmable frequency divider if the actual frequency determined in step (c) is above or below the predetermined frequency range adjusts the output supplied to the programmable frequency divider to adjust the nominal frequency of the local oscillator to compensate for changes in the carrier frequency of the radio frequency input signal.

13. A microprocessor controlled tuning system, comprising:
a tuner for receiving information bearing radio frequency signals and for producing an intermeidate frequency signal to serve as a carrier for said information bearing signals;
means for connecting the intermediate frequency signal to a microprocessor and for directly measuring the actual frequency of the intermediate freqeuncy signal; and
means for adjusting the tuner to compensate for variations in the actual frequency of the intermediate frequency signal caused by drifting of the information bearing radio frequency signal.

14. A microprocessor controlled tuning system according to claim 13, wherein said means for directly measuring the actual frequency of the intermediate frequency signal comprises a counting register in the microprocessor which is incremented by the intermediate frequency signal for a predetermined period of time to provide a direct measure of the actual frequency of the intermediate frequency signal.

15. A digitally controlled tuning system, comprising:
a superheterodyne tuner having an input coupled to a source of RF signals, an output at which an IF signal is produced, and a variable frequency local oscillator for selecting the RF signal to which the tuning system is tuned;
digital control means for controlling the frequency of the local oscillator to tune the tuning system to one of the RF signals;
means for coupling the digital control means to the local oscillator;
the digital control means including means for generating a digital value directly representative of the frequency of the IF signal;
means for coupling the digital control means to the output of the tuner; and
the digital control means including means for storing upper and lower limits, means for comparing the digital value representative of the frequency of the IF signal to the upper and lower limits and causing the local oscillator control means to adjust the frequency of the local oscillator when the digital value representative of the frequency of the IF signal does not fall within the upper and lower limits.

16. The tuning system of claim 15, wherein the local oscillator comprises a voltage controlled oscillator and the digital control means includes means for generating a voltage for setting the frequency of the voltage controlled oscillator, means for coupling the voltage generating means to the voltage controlled oscillator, and the comparing and adjusting means comprises means for causing the voltage generating means to vary the voltage provided to the voltage controlled oscillator in response to the digital value representative of the frequency of the IF signal falling outside the upper and lower limits.

17. The tuning system of claim 16, wherein the voltage generating means comprises a phase lock loop having a first input coupled to an output of the voltage controlled oscillator and a second input coupled to a reference frequency source, a programmable frequency divider for providing the reference frequency and means for programming the frequency divider to produce an appropriate frequency to cause the phase lock loop to generate an appropriate voltage at an output coupled to an input of the voltage controlled oscillator to set the frequency of the voltage controlled oscillator.

18. The tuning system of claim 17, wherein the comparing and adjusting means comprises means for varying the programming of the programmable frequency divider in response to the digital value representative of the frequency of the IF signal falling outside the upper and lower limits to vary the voltage at the output of the phase lock loop.

19. The system of claim 15 wherein the RF signals have carrier frequencies and the comparing and adjusting means causes the voltage generating means to vary the voltage provided to the voltage controlled osillator in response to the digital value representative of the frequency of the IF signal falling outside the upper and lower limits to adjust the frequency of the local oscillator to compensate for changes in the frequency of the carrier frequency of the RF signal to which the tuning system is tuned.

* * * * *

UNITED STATES PATENT AND TRADEMARK OFFICE
CERTIFICATE OF CORRECTION

PATENT NO. : 4,727,591

DATED : February 23, 1988

INVENTOR(S) : Nathan E. Manlove

It is certified that error appears in the above-identified patent and that said Letters Patent is hereby corrected as shown below:

At column 8, line 17, please delete "form" and insert therefor --from--;

At column 8, line 34, please delete "measureed" and insert therefor --measured--;

At column 9, line 2, please delete "3" and insert therefor --4--; and

At column 10, line 15, please delete "intermeidate" and insert therefor --intermediate--.

Signed and Sealed this

Twentieth Day of September, 1988

*Attest:*

DONALD J. QUIGG

*Attesting Officer*  *Commissioner of Patents and Trademarks*